US006967385B2

(12) United States Patent
Fukunaga et al.

(10) Patent No.: US 6,967,385 B2
(45) Date of Patent: Nov. 22, 2005

(54) INK JET RECORDING HEAD AND METHOD FOR MANUFACTURING THE SAME

(75) Inventors: Hideki Fukunaga, Kanagawa (JP); Hiroyuki Usami, Kanagawa (JP); Hiroshi Ikeda, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 71 days.

(21) Appl. No.: 10/629,651

(22) Filed: Jul. 30, 2003

(65) Prior Publication Data

US 2004/0109048 A1 Jun. 10, 2004

(30) Foreign Application Priority Data

Dec. 6, 2002 (JP) ............................ 2002-354823

(51) Int. Cl.[7] ............................................ H01L 29/84
(52) U.S. Cl. ......................................... 257/415; 347/66
(58) Field of Search .......................... 438/21; 257/414, 257/415; 347/66, 108; 216/27

(56) References Cited

FOREIGN PATENT DOCUMENTS

| | | | | |
|---|---|---|---|---|
| JP | 5-330066 | 12/1993 | | |
| JP | 6-286149 | 10/1994 | | |
| JP | 2000-351214 | * 12/2000 | ............. | B41J 2/05 |

* cited by examiner

*Primary Examiner*—W. David Coleman
(74) *Attorney, Agent, or Firm*—Morgan, Lewis & Bockius LLP

(57) ABSTRACT

In order to that stress generated within a resin can be suppressed and cracking in the resin can be prevented, an ink jet recording head comprising a substrate; a resin body, which defines an ink discharge section, formed on the substrate; and a heating resistor provided on the substrate, an ink chamber being formed between the heating resistor and the ink discharge section, the resin body being dug down along the ink chamber, is provided.

5 Claims, 8 Drawing Sheets

INK JET RECORDING HEAD AND METHOD FOR MANUFACTURING THE SAME

CROSS-REFERENCE TO RELATED APPLICATION

This application claims priority under 35 USC 119 from Japanese Patent Application No. 2002-354823, the disclosure of which is incorporated by reference herein.

BACKGROUND OF THE INVENTION

1. Field of the Invention

The present invention relates to an ink-jet recording head using an ink jet recording system, and a method for manufacturing the ink jet recording head.

2. Description of the Related Art

As a method for manufacturing an ink jet recording head, conventional technique mentioned below is known.

A mold (male type) for an ink channel (path) is formed on a substrate by using a resist having solubility. Then, the mold is coated by a resin. Thereafter, the resist is eluted. In this way, the ink channel is formed without carrying out cutting process (for example, see Japanese Patent Application Laid-Open (JP-A) No. 5-330066, FIG. 7; and JP-A No. 6-286149, FIG. 5).

Concretely, after forming an ink supplying opening 208 on a substrate 201 on which heating resistors 202 are formed, a mold (male type) for an ink channel is formed on the substrate 201 by using a resist 203 having solubility (see FIG. 10A).

After a resin 205 is coated on the resist 203, patterning is carried out by a resist 204 on the resin 205 (see FIG. 10B).

Etching is carried out for the resist 205 with the resist 204 being used a mask to form ink discharge sections 206. Thereafter, the resist 203 having solubility is flown out (eluted). Thus, the ink channel 209 is formed (see FIG. 10C).

However, in a case in which the resin 205 is formed, with a single layer, on the whole surface of the substrate 201 at which the mold for the ink channel 209 is formed by the resist 203, a region other than the mold for the ink channel 209 is covered by the resin 205 of thick thickness, in order to make thickness of a region at which the ink discharge sections 206 are formed and is positioned above the ink channel 209, to be a desired thickness. In such a case in which the whole substrate 201 is covered by the thick resin 205, when the substrate is subject to heat treatment, stress is generated within the resin 205 due to difference between coefficients of thermal expansions of the substrate 201 and the resin 205 covering the substrate 201. This causes cracking in the resin.

The thicker a thickness of the resin is and/or the wider an area of the covering region of the resin is, the larger the stress generated within the resin becomes. Accordingly, in order to prevent cracking, it is necessary to reduce the stress by limiting a region on the substrate, where the resin covers, or by limiting a region on the substrate, where the resin covers with thick thickness.

SUMMARY OF THE INVENTION

In view of the aforementioned circumstances, an object of the present invention is to provide an ink jet recording head in which stress generated at a resin on a substrate can be suppressed and cracking can be prevented, and also provide a method for manufacturing the ink jet recording head.

A first aspect of the present invention is an ink jet recording head comprising a substrate; a resin body, which defines an ink discharge section, formed on the substrate; and a heating resistor provided on the substrate, an ink chamber being formed between the heating resistor and the ink discharge section, wherein the resin body is dug down along the ink chamber.

In the structure mentioned above, the resin body defining (including) the ink discharge section and formed on the substrate is dug down along the ink chamber, preferably, is dug down at both sides of the ink chamber (along a longitudinal direction of the ink chamber, namely, a direction in which the ink discharge sections are arranged) to form the wall portion of the ink chamber.

As a result, a region (area) in which thickness of the resin is thick can be reduced, or can be removed. Therefore, stress generated within the resin can be suppressed and cracking in the resin can be prevented.

A second aspect of the present invention is a method for manufacturing an ink jet recording head, the method comprising the steps of: forming a first resin which defines a configuration of an ink chamber on a substrate on which a heating resistor is provided; forming a second resin which covers the first resin, the second resin forming the ink chamber; defining an ink discharge section by removing a part of the second resin; forming a stepped portion along the ink chamber by removing the second resin while leaving a part of the second resin which serves as a wall of the ink chamber; and forming the ink chamber by removing the first resin.

In the method mentioned above, the first resin for defining the configuration of the ink chamber (the internal configuration of the ink chamber) is covered by the second resin for forming the ink chamber. The second resin is processed by etching or the like to form the ink discharge section. Further, the stepped portion along the ink chamber (at both sides of the ink chamber) is formed by removing the second resin while leaving a part of the second resin, which will become the wall portion of the ink chamber. Thus, the outline (the wall portion) of the ink chamber is formed. Further, the first resin is removed after the ink supplying opening is formed. Thus, the internal structure of the ink chamber is formed.

As a result, the resin at the both sides of the walls of the ink chamber can be removed. Therefore, thickness of the resin which is other than the wall portion of the ink chamber, can be suppressed. Accordingly, stress generated within the resin can be suppressed and cracking in the resin can be prevented.

In a method for manufacturing an ink jet recording head of a third aspect of the present invention according to the second aspect, the first resin is a resist of positive type.

In the method mentioned above, due to using the resist of positive type by which high resolution can be realized, high accuracy shaping (patterning) becomes possible. Further, there in no affection of reflection from a surface of the substrate, develop-residual and the like.

In a method for manufacturing an ink jet recording head of a fourth aspect of the present invention according to the second aspect, the first resin is coated on the substrate in a spin-coating method, and the first resin is solidified by the first resin being cured together with the substrate.

In the method mentioned above, due to using the spin-coating method in which coating is carried out on the rotated substrate, a thin film of uniform thickness can be formed. Further, film thickness ununiformity at a time of drying can be prevented by carrying out curing and solidifying together with the substrate.

In a method for manufacturing an ink jet recording head of a fifth aspect of the present invention according to the second aspect, the first resin defining the configuration of the ink chamber is formed by dry-etching with oxide-plasma.

In the method mentioned above, the first resin is processed by dry-etching. Therefore, high accuracy processing in accordance with the resist pattern can be carried out.

In a method for manufacturing an ink jet recording head of a sixth aspect of the present invention according to the second aspect, the second resin is a resist of negative type.

In the method mentioned above, due to using the resist of negative type of which mechanical strength is excellent and the coated film thickness can be thin, thickness of the resin in the vicinity of the ink chamber can be thin.

In a method for manufacturing an ink jet recording head of a seventh aspect of the present invention according to the second aspect, the second resin is coated on the substrate in a spin-coating method, and the second resin is solidified by the second resin being cured together with the substrate.

In the method mentioned above, due to using the spin-coating method, a thin film of uniform thickness can be formed. Further, film thickness ununiformity at a time of drying can be prevented by carrying out curing and solidifying together with the substrate.

In a method for manufacturing an ink jet recording head of an eighth aspect of the present invention according to the second aspect, the ink discharge section is defined by dry-etching.

In the method mentioned above, the ink discharge section is shaped by dry-etching. Therefore, high accuracy processing in accordance with the resist pattern can be carried out.

In a method for manufacturing an ink jet recording head of a ninth aspect of the present invention according to the second aspect, the method further comprises the step of forming an ink supplying opening in the substrate from a back side of the substrate, and the ink supplying opening is formed after the ink discharge section is defined (formed).

In the method mentioned above, the shaping process of the ink supplying opening, in which the opening is formed on the substrate, is carried out after shaping process of the ink discharge section. Therefore, coating of the liquid-resin can be carried out at a time of the shaping process of the ink discharge section.

As a result, it is not necessary to carrying out an alignment (registering), which is necessary in laminating process or the like.

In a method for manufacturing an ink jet recording head of a tenth aspect of the present invention according to the second aspect, the second resin has laminated structure having a plurality of layers, each of the layers being of the same substance.

In the method mentioned above, the second resin for forming the ink chamber has laminated structure having a plurality of layers, each of the layers being the same substance. Therefore, a risk of generating of surfaces of discontinuity and/or cracking in the second resin can be suppressed.

An eleventh aspect of the present invention is an ink jet cartridge comprising an ink jet recording head comprising a substrate; a resin body, which defines an ink discharge section, formed on the substrate; and a heating resistor provided on the substrate, an ink chamber being formed between the heating resistor and the ink discharge section, the resin body being dug down along the ink chamber to form a wall portion of the ink chamber; and an ink tank.

In the structure mentioned above, the ink jet cartridge is provided with the ink jet recording head in which the resin body, which is provided on the substrate and has the ink discharge section, is dug down along the ink chamber to form a wall portion of the ink chamber.

As a result, a region (area) in which thickness of the resin is thick can be reduced, or can be removed. Therefore, the ink jet cartridge provided with the ink jet recording head in which stress generated within the resin body can be suppressed and cracking in the resin body can be prevented, and the ink tank which is integrated with the ink jet recording head or is separated from the ink jet recording head, can be provided.

An twelfth aspect of the present invention is an ink jet printer comprising an ink jet recording head comprising a substrate; a resin body, which defines an ink discharge section, formed on the substrate; and a heating resistor provided on the substrate, an ink chamber being formed between the heating resistor and the ink discharge section, the resin body being dug down along the ink chamber to form a wall portion of the ink chamber.

In the structure mentioned above, the ink jet printer is provided with the ink jet recording head in which the resin body, which is provided on the substrate and has the ink discharge section, is dug down along the ink chamber to form a wall portion of the ink chamber.

As a result, a region (area) in which thickness of the resin is thick can be reduced, or can be removed. Therefore, the ink jet printer provided with the ink jet recording head in which stress generated within the resin body can be suppressed and cracking in the resin body can be prevented, can be provided.

In an ink jet recording head of a thirteenth aspect of the present invention according to the first aspect, a thickness of the resin body in a region outside the wall portion of the ink chamber is thinner than that of the wall portion.

In an ink jet recording head of a fourteenth aspect of the present invention according to the first aspect, the resin body at a region outside the wall portion of the ink chamber is removed.

In a method for manufacturing an ink jet recording head of a fifteenth aspect of the present invention according to the second aspect, an open region into which the coated second resin is entered is formed.

DETAILED DESCRIPTION OF THE INVENTION

Figure 1:
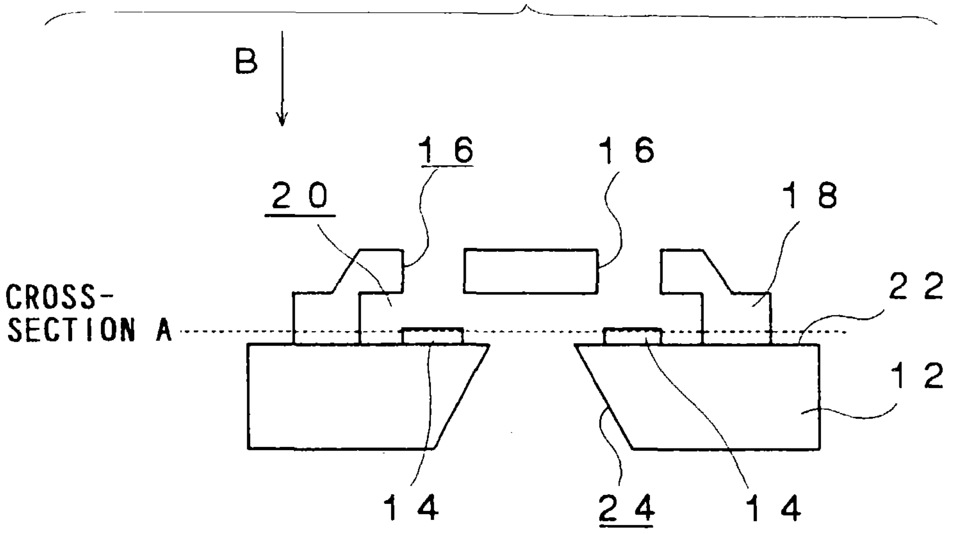
FIG. 1 is a cross sectional view of an ink jet recording head relating to a first embodiment of the present invention.

In FIG. 1, an ink jet recording head 10 relating to a first embodiment of the present invention is shown.

A resin body 18 having an ink discharge sections 16 and heating resistors 14 are provided on a substrate 12. A ink chamber 20 is formed between the heating resistor 14 and the ink discharge section 16.

Figure 2:
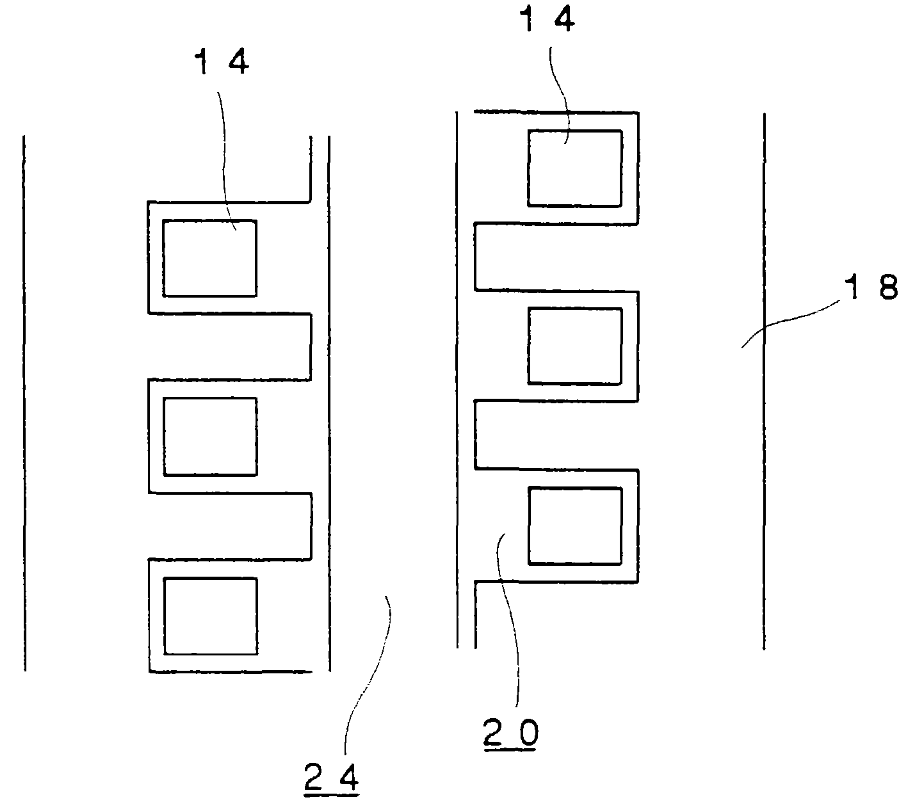
FIG. 2 is a plane view of the ink jet recording head relating to the first embodiment of the present invention.

In FIG. 2, arrangement of the resin body 18, the heating resistors 14, an ink supplying opening 24 and the ink chambers 20, when a cross section A in FIG. 1 is seen from a direction indicated by an arrow B, is shown.

Here, the heating resistors 14 are arranged in two lines in a longitudinal direction of the ink-jet recording head 10 at equal intervals. In addition, the heating resistors 14 are arranged in zigzag manner. That is, an one line of the two lines is shifted in the longitudinal direction with respect to the other of the two lines by a distance of a half of the interval of the heating resistors 14, in the longitudinal direction. As a result, resolution of an ink-image in the longitudinal direction in this case can be made twice as large as that of one line of the heating resistors 14. For example, in a case in which the resolution of the one line of the heating resistors 14 in the longitudinal direction is 600 dpi, the resolution of the two lines of the heating resistors 14 arranged in the zigzag manner becomes 1200 dpi.

Further, due to the heating resistors 14 being arranged in the zigzag manner at both sides of the ink supplying opening 24, portions of the resin body 18, whose thickness in a width direction are thin, can be arranged alternately. Therefore, strength of the resin body 18 can be improved.

Figure 3:
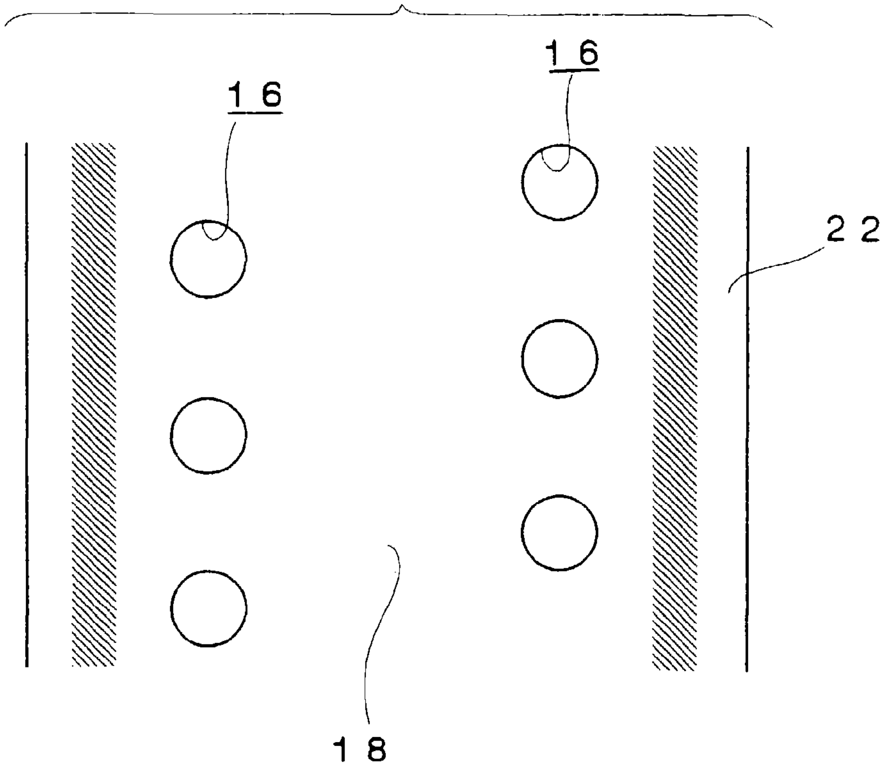
FIG. 3 is a plane view of the ink jet recording head relating to the first embodiment of the present invention.

In FIG. 3, arrangement of the resin body 18, the ink discharge sections 16 and a removed region 22, when a surface of the ink-jet recording head 10 in FIG. 1 is seen from the direction indicated by the arrow B, is shown. Dots can be got near each other without miniaturizing the ink discharge section 16 itself, due to the ink discharge sections 16 being arranged in the zigzag manner. Therefore, resolution of printing can be improved.

As mentioned above, the resin body 18 exists only at a wall portion of the ink chamber 20, that is, the resin body 18 exists only in the vicinity of the ink chamber 20, due to outline of the ink chamber 20 having a convex configuration from the substrate 12 in a ink discharging direction. That is, a resin layer of thick thickness surrounding the ink chamber 20 does not exist other than the wall portion. Therefore, danger of cracking due to stress generated inside the resin can be suppressed.

Figure 4:
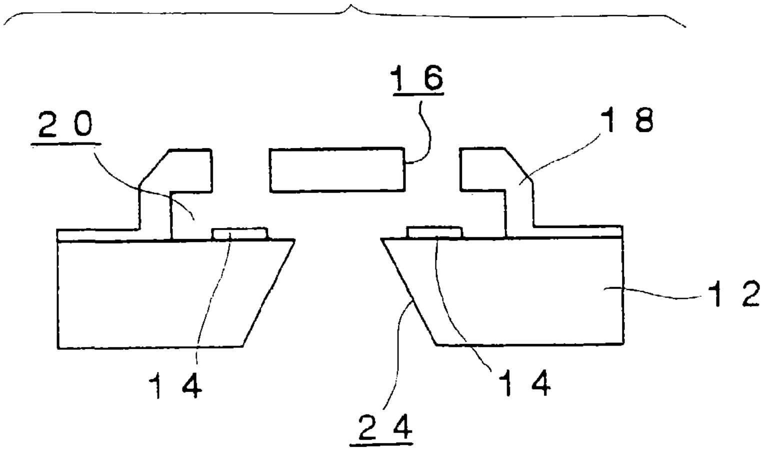
FIG. 4 is a cross-sectional view of an ink jet recording head relating to a second embodiment of the present invention.

In FIG. 4, an ink-jet recording head 11 relating to a second embodiment of the present invention is shown.

A resin body 18 having heating resistors 14 and ink discharge sections 16 is provided on a substrate 12. Each ink chamber 20 is formed between the heating resistor 14 and the ink discharge section 16.

Only in the vicinity of each ink chamber 20, that is, a wall portion of each ink chamber 20, the resin body 18 serves as a structure member whose thickness is thick. Further, in a region other than the region in the vicinity of the ink chamber 20, thickness of the resin body 18 is thin. As a result, the resin body forming the ink chamber has a convex configuration with respect to the substrate 12 in a ink discharging direction.

As a result, thickness of layer of the resin body 18 surrounding the wall portion of the ink chamber 20 becomes thin. Therefore, danger of cracking due to stress generated inside the resin body 18 can be suppressed.

Next, a first manufacturing method of an ink jet recording head of the present invention will be explained.

Figure 5A:
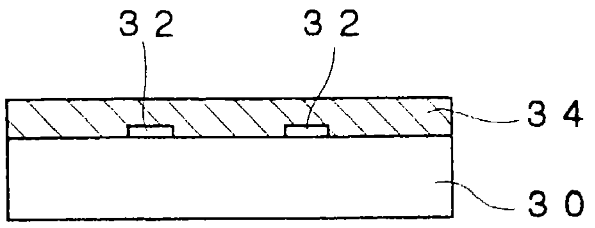
FIGS. 5A to 5F are cross sectional views which show a first method for manufacturing an ink-jet recording head of the present invention.

First, a resist 34, serving as a first resin, having thick thickness (hereinafter, a thick film resist 34) is coated in a spin manner on a substrate 34 provided with heating resistors 32 (see FIG. 5A).

Figure 5B:
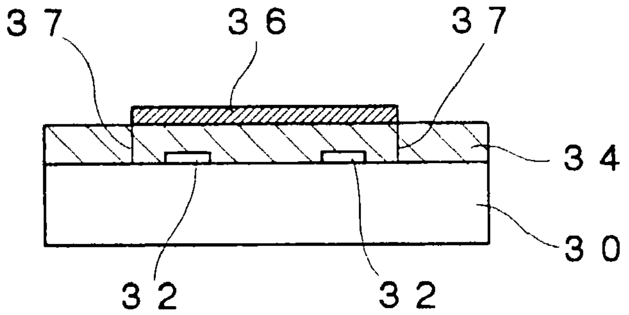

After an oxidation-resistant plasma resist 36 is coated in a spin manner on the thick film resist 34, exposing and developing are carried out to form an ink chamber forming pattern 37 from the oxidation-resistant plasma resist 36 (see FIG. 5B).

Figure 5C:
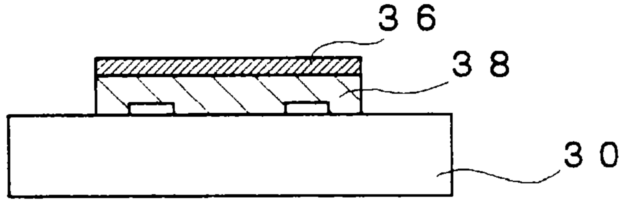

With the oxidation-resistant plasma resist 36 being used as a mask, the thick film resist 34 is dry-etched by using oxide-plasma. As a result, the ink chamber pattern 38 is formed from thick film resist 34 (see FIG. 5C).

Next, the oxidation-resistant plasma resist 36 remained on the ink chamber pattern 38 of the thick film resist 34 is removed by using a remover liquid.

Figure 5D:
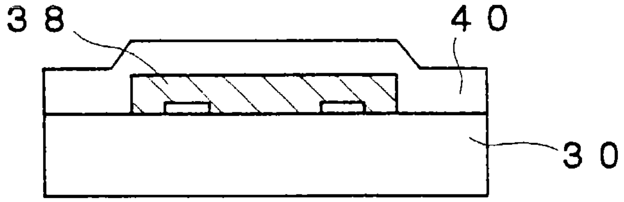

A resin 40, serving as a second resin, having photosensitivity is coated in a spin manner on the substrate 30 on which each ink chamber pattern 38 by the thick film resist 34 is formed (see FIG. 5D).

Figure 5E:
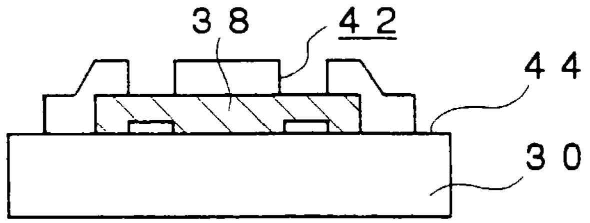

Exposing and developing for the resin 40 are carried out to open the ink discharge section 42. Further, together with this, a removed region 44 is formed by removing the first resin 40 in a region other than a region in the vicinity of the ink chamber pattern 38 of the thick film resist 34 (see FIG. 5E).

Figure 5F:
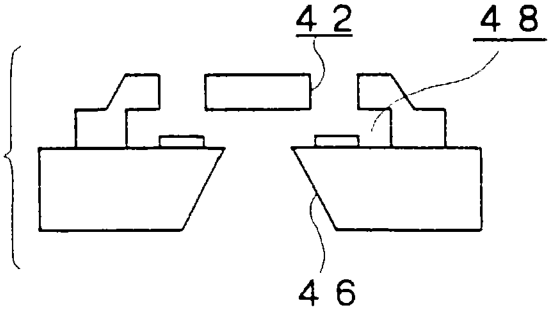

An ink supply opening 46 for supplying an ink is formed at a back surface of the substrate 30 by etching from the back surface of the substrate 30. Further, the ink chamber pattern 38 formed by the thick film resist 34 is removed by dipping the substrate 34 in a resist remover liquid. As a result, each ink chamber 48, from the ink supply opening 46 to the ink discharge section 42, is formed, thus, manufacturing of the ink jet recording head 10 is completed (see FIG. 5F).

In the present method, the ink chamber pattern 38 from the thick film resist 34 is formed by carrying out dry-etching thereon. However, the present invention is not limited to the same. The ink chamber pattern can be formed by using a thick film resist having photosensitivity and by carrying out photolithography.

As mention above, the resin 40 exists only at a wall portion of the ink chamber 48, that is, the resin 40 exists only in the vicinity of the ink chamber 48. As a result, a resin layer of thick thickness surrounding the ink chambers 48 does not exist other than the wall portion. Therefore, danger of cracking due to stress generated inside the resin 40 can be suppressed.

Next, a second manufacturing method of an ink jet recording head of the present invention will be explained.

Figure 6A:
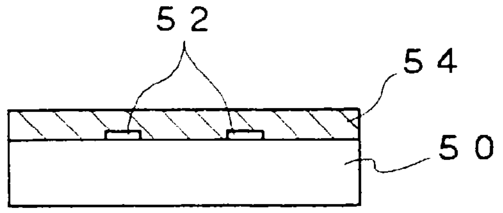
FIGS. 6A to 6G are cross sectional views which show a second method for manufacturing an ink-jet recording head of the present invention.

First, a resist 54, serving as first resin, having thick thickness (hereinafter, a thick film resist 54) is coated in a spin manner on a substrate 50 provided with heating resistors 52 (see FIG. 6A).

Figure 6B:
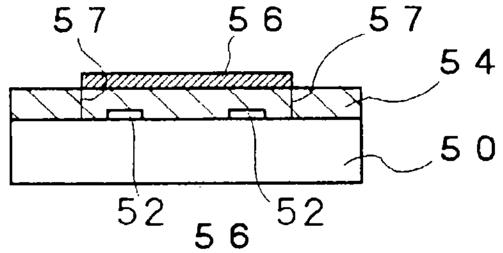

After an oxidation-resistant plasma resist 56 is coated in a spin manner on the thick film resist 54, exposing and developing are carried out to form an ink chamber forming pattern 57 from the oxidation-resistant plasma resist 56 (see FIG. 6B).

Figure 6C:
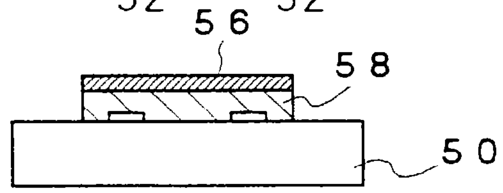

With the oxidation-resistant plasma resist 56 being used as a mask, the thick film resist 54 is dry-etched by using oxide-plasma. As a result, the ink chamber pattern 58 is formed from the thick film resist 54 (see FIG. 6C).

Next, the oxidation-resistant plasma resist 56 remained on each ink chamber pattern 58 of the thick film resist 54 is removed by using a remover liquid.

Figure 6D:
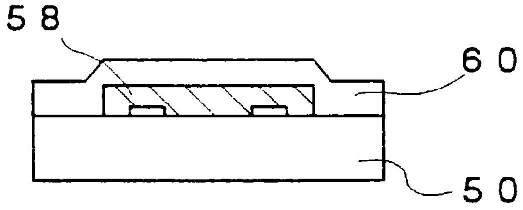

A resin 60, serving as a second resin, having photosensitivity is coated in a spin manner on the substrate 50 on which each ink chamber pattern 58 by the thick film resist 54 is formed (see FIG. 6D).

Figure 6E:
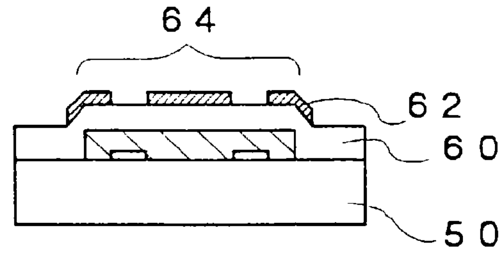

An oxidation-resistant plasma resist 62 is coated in a spin manner on the resin 60. Then, exposing and developing are carried out for the oxidation-resistant plasma resist 62 to form a pattern for removing 64 (see FIG. 6E).

Figure 6F:
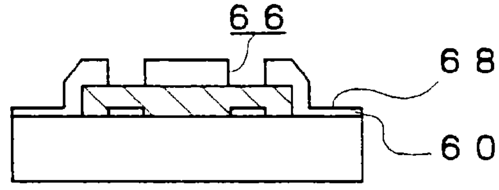

With the pattern for removing 64 (the oxidation-resistant plasma resist) being used as a mask, the resin 60 is dry-etched by using oxide-plasma. As a result, the ink discharge sections 66 are formed (opened). Together with this, a removed-region is formed by removing the resin 60 in a region other than a region in the vicinity of the ink chamber pattern 58 of the thick film resist 54 (see FIG. 6F by referring to FIG. 1).

Alternatively, etching enough for opening the discharge sections 66 is carried out by considering and using the difference of film thicknesses between the resin 60 at the ink discharge section 66 and the resin 60 in the region other than the region in the vicinity of the ink chamber pattern 58. That is, thickness of the resin 60 in the region other than the region in the vicinity of the ink chamber pattern 58 becomes thin after etching (see FIG. 6F).

As a result, a stepped portion is formed between the region in the vicinity of the ink chamber pattern 58 and the region other than the region in the vicinity of the ink chamber pattern 58 in the resin 60. Therefore, the resin 60 forming the ink chamber 70 has a convex configuration in an ink discharging direction (a direction indicated by an arrow A).

Figure 6G:
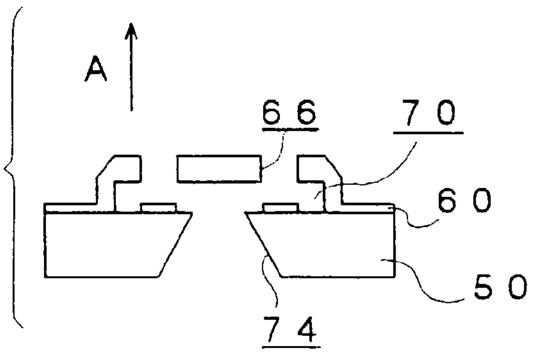

Next, the pattern for removing 64 remained on the resin 60 is removed by using a remover liquid. Further, an ink supply opening 74 for supplying an ink is formed at a back surface of the substrate 50 by etching from the back surface of the substrate 50. Further, the ink chamber pattern 58 formed from the thick film resist 54 is removed by dipping the substrate 50 in a resist remover liquid. As a result, each ink chamber 70, from the ink supply opening 74 to the ink discharge section 66, is formed. Thus, manufacturing of the ink jet recording head 11 is completed (see FIG. 6G).

Next, a third manufacturing method of an ink jet recording head of the present invention will be explained.

Figure 7A:
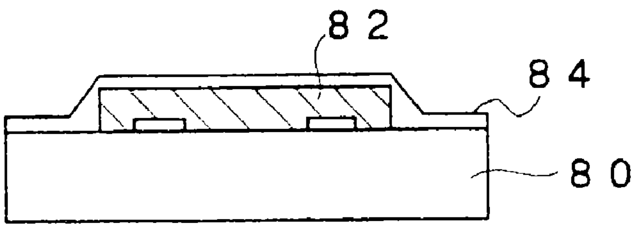
FIGS. 7A to 7E are cross sectional views which show a third method for manufacturing an ink-jet recording head of the present invention.

First, in the similar ways of the first and the second manufacturing methods described above, each ink chamber pattern 87 is formed by a resist, serving as a first resin, having thick thickness (hereinafter, a thick film resist) on a substrate 80. Then, a resin 84 having a negative type photosensitivity is coated in a spin manner (see FIG. 7A). Further, the whole surface of this negative type photosensitive resin 84, serving as a second resin, is exposed and this negative type photosensitive resin 84 is hardened.

Figure 7B:
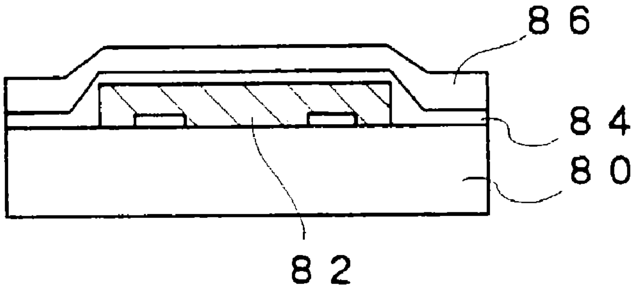

Subsequently, a resin 86, also serving as the second resin, having photosensitivity is coated in a spin manner on the resin 84 (see FIG. 7B).

Figure 7C:
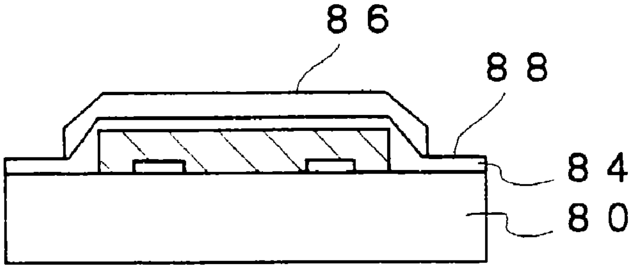

Further, exposing and developing are carried out for the photosensitive second resin 86, a removed-region 88 is formed by removing the second resin 86 in a region other than a region in the vicinity of the ink chamber pattern 82 (see FIG. 7C).

Figure 7D:
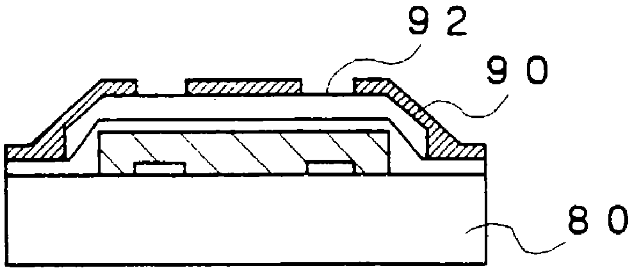

An oxidation-resistant plasma resist 90 is coated in a spin manner on the resin 84 and the resin 86. Then, exposing and developing are carried out for the oxidation-resistant plasma resist 90 to form a pattern for an ink discharge section 92 (see FIG. 7D).

Figure 7E:
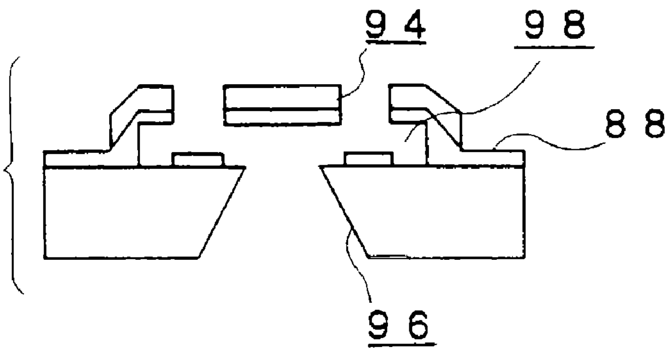

With the oxidation-resistant plasma resist 90 being used as a mask, the resin 84 and the resin 86 are dry-etched by using oxide-plasma. As a result, the ink discharge sections 94 are formed (opened). Further, an ink supply opening 96 for supplying an ink is formed at a back surface of the substrate 80 by etching from the back surface of the substrate 80. Thereafter, the thick film resist 82 forming the ink chamber pattern is removed by using a resist remover liquid. Thus, the ink chamber 98 is formed (see FIG. 7E).

Next, a fourth manufacturing method of an ink jet recording head of the present invention will be explained.

Figure 8A:
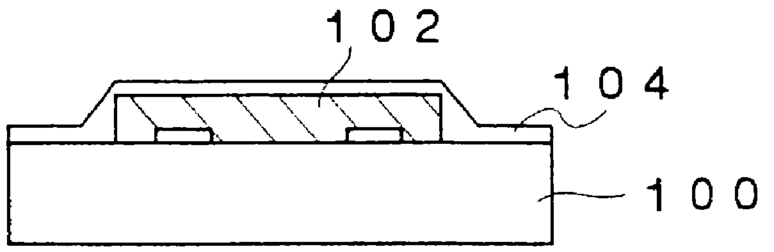
FIGS. 8A to 8D are cross sectional views which show a fourth method for manufacturing an ink-jet recording head of the present invention.

First, in the similar ways of the first, second and the third manufacturing methods described above, each ink chamber pattern 102 is formed by a resist, serving as a first resin, having thick thickness (hereinafter, a thick film resist) on a substrate 100. Then, a resin 104 having photosensitivity is coated in a spin manner on the thick film resist (see FIG. 8A).

Figure 8B:
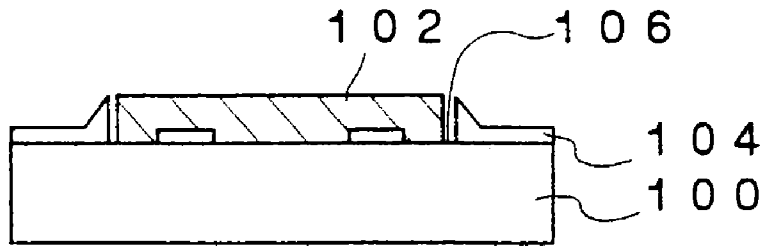

Exposing and developing are carried out for the photosensitive resin 104, and a removed region 106 is formed by removing the resin 104 in the vicinity of the ink chamber pattern 102 (see FIG. 8B).

Figure 8C:
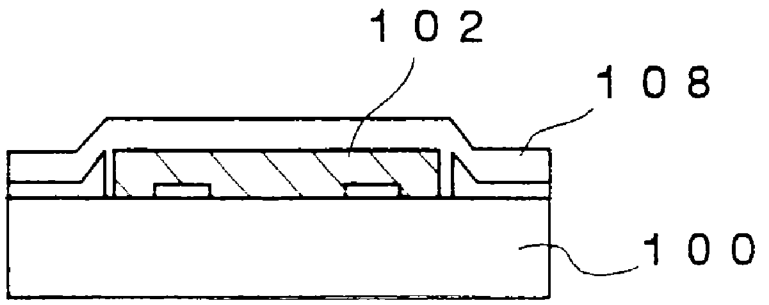

A resin 108 having photosensitivity is coated in a spin manner on the ink chamber pattern 102 and the resin 104 (see FIG. 8C).

Figure 8D:
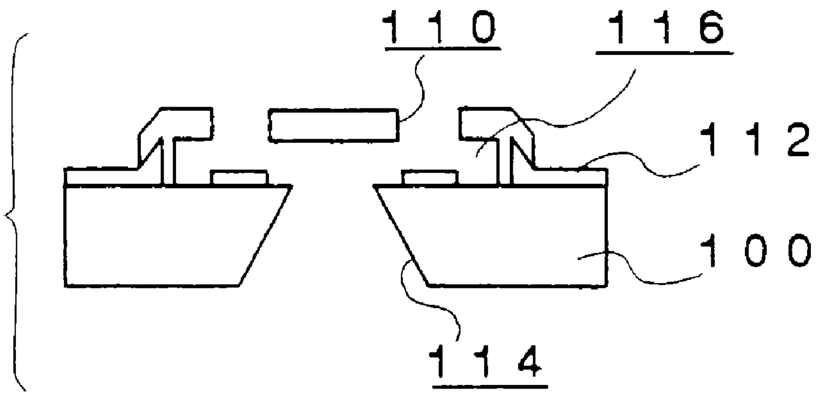

Exposing and developing are carried out for the photosensitive resin 108, and ink discharge sections 110 are formed (opened). Together with this, a thin film region 112 is formed in the resin 108 in a region other than a region in the vicinity of the ink chamber pattern 102. Further, an ink supply opening 114 for supplying an ink is formed at a back surface of the substrate 100 by etching from the back surface of the substrate 100. Thereafter, the thick film resist forming the ink chamber pattern 102 is removed by using a resist remover liquid. Thus, the ink chamber 116 is formed (see FIG. 8D).

In the present manufacturing method, the removed region 106 is formed by removing the first resin 104 in the vicinity of the ink chamber pattern 102. When the resin is coated on the thick film resist, the resin is made to have a convex configuration due to surface tension thereof. As a result, the resin in the vicinity of the ink discharge sections 110 becomes ununiform. Therefore, in order to prevent this, the removed region 106 is provided. When the resin 108 is coated, the resin 108 is pulled due to the removed region 106 (due to the resin 108 entering into the removed region 106). As a result, the resin on the thick film resist becomes flat.

Figure 9:
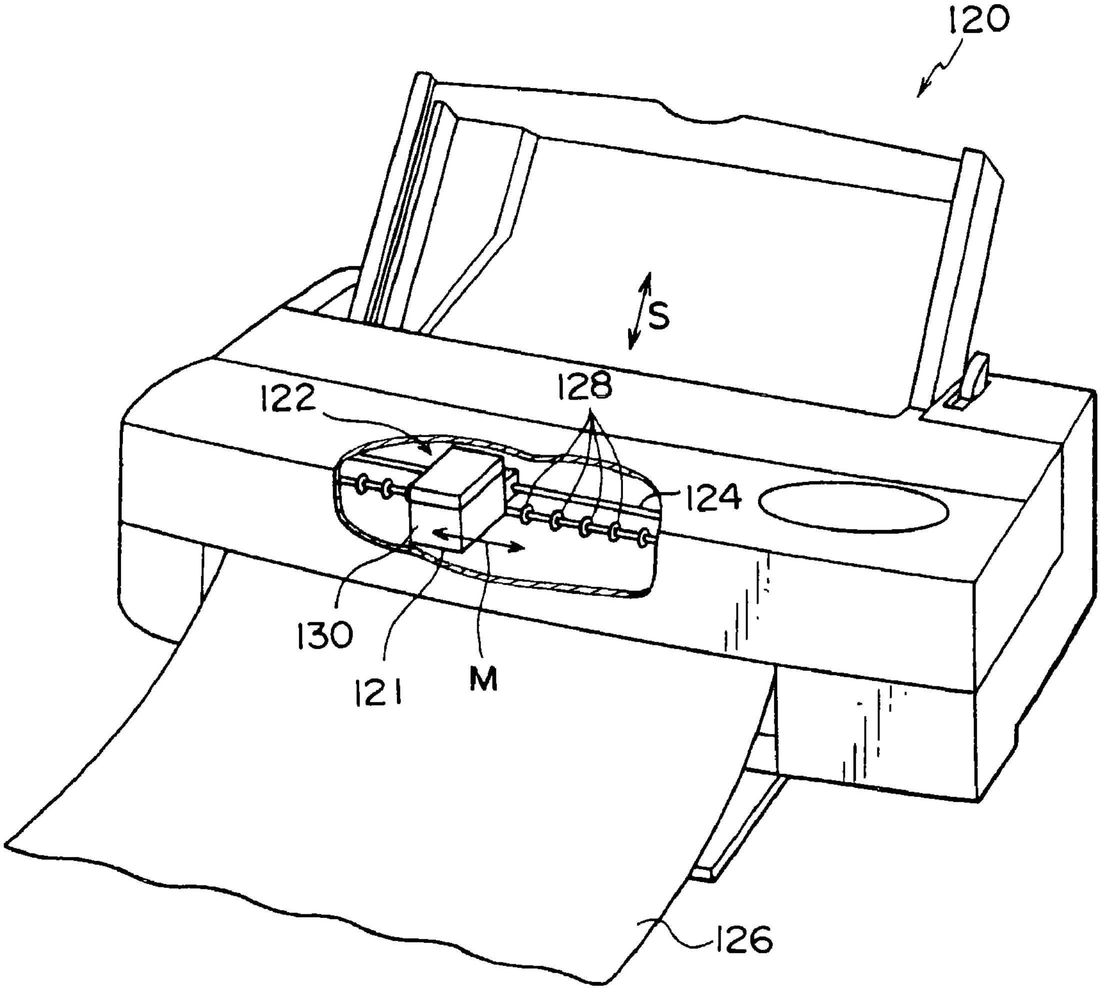
FIG. 9 is a perspective view of an ink jet printer relating to an embodiment of the present invention.
Figure 10A:
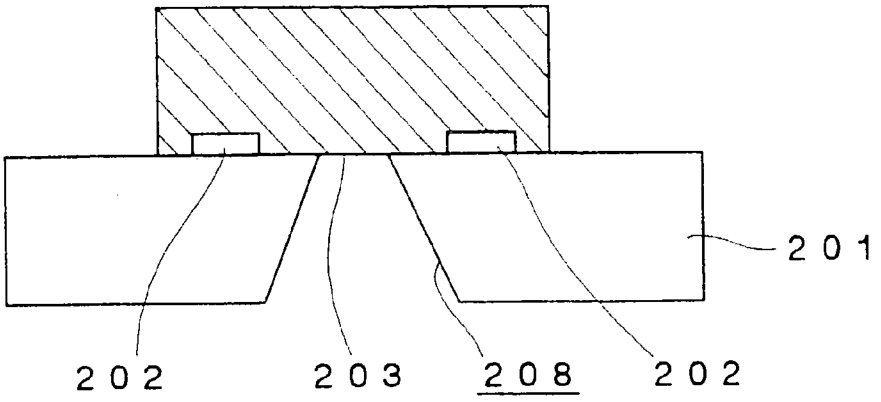
FIGS. 10A to 10C are cross sectional views which show a method for manufacturing a conventional ink-jet recording head.
Figure 10B:
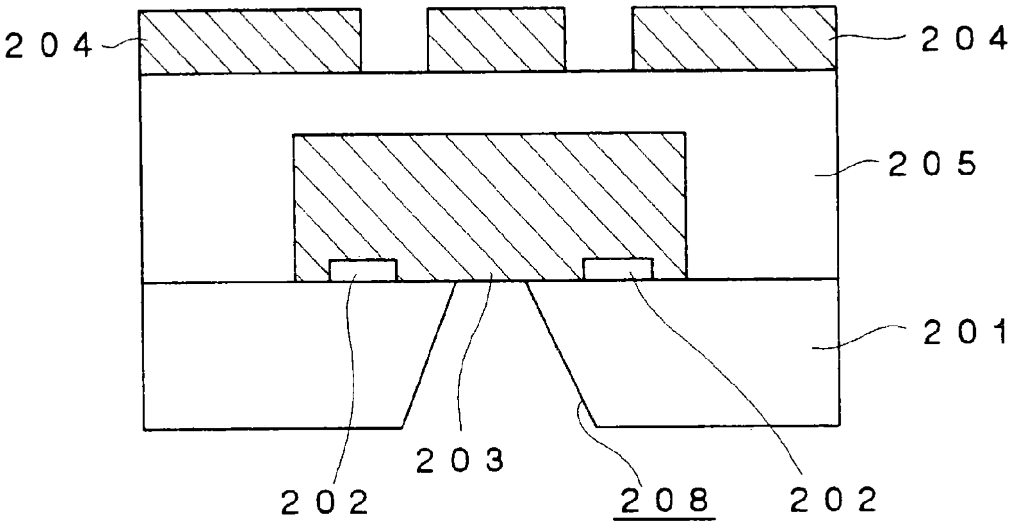
Figure 10C:
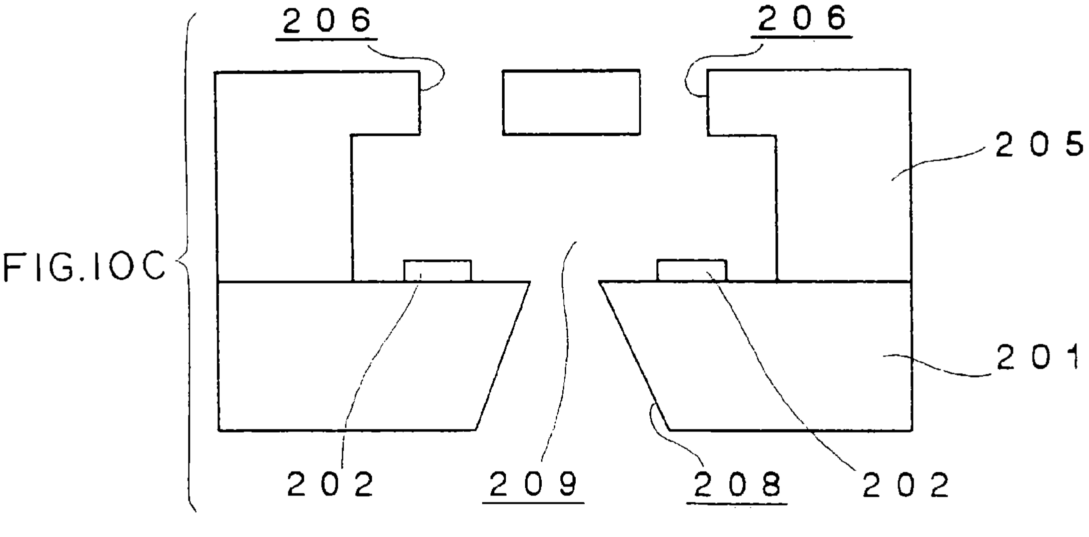

In FIG. 9, an ink jet printer 120 relating to an embodiment of the present invention is shown.

As shown in FIG. 9, the ink jet printer 120 is provided with a carriage 122 on which an ink jet recording head 121 is mounted. The carriage 122 moves in a main scanning direction (a direction indicated by an arrow M) along a shaft 124 provided at the ink jet printer 120.

Further, conveyance rollers 128 for conveying a recording paper 126 are provided at the ink jet printer 120. The recording paper 126 is nipped by the conveyance rollers 128 and conveyed. Thus, the recording paper 126 moves in a sub scanning direction (a direction indicated by an arrow S).

The ink jet recording head 121 (the carriage 122) is provided with an ink tank 130. The ink jet recording head 121 is positioned at a side, facing the recording paper 126, of the ink tank 130, that is, a lower side of the ink tank 130 in FIG. 9. In the ink jet recording head 121 relating to the embodiment of the present invention, a longitudinal direction corresponds to the sub scanning direction and a short side direction corresponds to the main scanning direction. Therefore, in FIG. 9, the longitudinal direction is indicated by the arrow S and the short side direction is indicated by the arrow M.

In the structures and methods of the present invention, because of the structures mentioned above, the ink jet printer, in which stress generated at the resin on the substrate can be suppressed, therefore, cracking at the resin can be prevented, can be provided.

What is claimed is:

1. An ink jet cartridge having an ink tank and an ink jet recording head, the ink jet recording head comprising:

a substrate;

a resin body, which defines an ink discharge section, formed on the substrate; and a heating resistor provided on the substrate, an ink chamber being formed between the heating resistor and the ink discharge section, the resin body being dug down along the ink chamber to form a wall portion of the ink chamber, a thickness of the resin body at a region outside the wall portion of the ink chamber being thinner than that of the wall portion.

2. An ink jet printer having an ink jet recording head, the ink jet recording head comprising:

a substrate;

a resin body, which defines an ink discharge section, formed on the substrate; and a heating resistor provided on the substrate, an ink chamber being formed between the heating resistor and the ink discharge section, the resin body being dug down along the ink chamber to form a wall portion of the ink chamber, a thickness of the resin body at a region outside the wall portion of the ink chamber being thinner than that of the wall portion.

3. An ink jet recording head comprising:

a substrate;

a resin body, which defines an ink discharge section, formed on the substrate; and a heating resistor provided on the substrate, an ink chamber being formed between the heating resistor and the ink discharge section, wherein the resin body is dug down along the ink chamber to form a wall portion of the ink chamber, and a thickness of the resin body at a region outside the wall portion of the ink chamber is thinner than that of the wall portion.

4. An ink jet recording head according to claim 3, wherein the resin body includes a laminated structure having a plurality of layers.

5. An ink jet recording head according to claim 3, the resin body comprising:

a first resin body at which a removed region is formed, and a second resin body, a portion of which is provided in the removed region and on the first resin body.

* * * * *